United States Patent
Cheng et al.

(10) Patent No.: US 12,219,885 B2
(45) Date of Patent: Feb. 4, 2025

(54) REDUCING CONTACT RESISTANCE OF PHASE CHANGE MEMORY BRIDGE CELL

(71) Applicant: International Business Machines Corporation, Armonk, NY (US)

(72) Inventors: Kangguo Cheng, Schenectady, NY (US); Juntao Li, Cohoes, NY (US); Zuoguang Liu, Schenectady, NY (US); Arthur Gasasira, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 17/531,149

(22) Filed: Nov. 19, 2021

(65) Prior Publication Data

US 2023/0165170 A1    May 25, 2023

(51) Int. Cl.
*H10N 70/20* (2023.01)
*H10B 63/10* (2023.01)
*H10N 70/00* (2023.01)

(52) U.S. Cl.
CPC ........... *H10N 70/231* (2023.02); *H10B 63/10* (2023.02); *H10N 70/021* (2023.02); *H10N 70/823* (2023.02); *H10N 70/841* (2023.02); *H10N 70/8828* (2023.02)

(58) Field of Classification Search
CPC .................................................. H10N 70/231
See application file for complete search history.

(56) References Cited

U.S. PATENT DOCUMENTS

| | | |
|---|---|---|
| 5,714,768 A | 2/1998 | Ovshinsky |
| 6,894,305 B2 | 5/2005 | Yi |
| 7,723,712 B2 | 5/2010 | Liu |
| 7,755,075 B2 | 7/2010 | Hayakawa |
| 9,318,700 B2 | 4/2016 | Wu |
| 9,543,515 B2 | 1/2017 | Gealy |
| 10,008,667 B2 | 6/2018 | Fumagalli |
| 10,991,879 B2 | 4/2021 | Ruiz |
| 2020/0365654 A1* | 11/2020 | Takahashi ............ H10N 70/841 |

FOREIGN PATENT DOCUMENTS

CN    112117298 B    3/2021

OTHER PUBLICATIONS

Anonymous, The Marvelous CASCOD: Microelectronic Devices and Circuits 2009—Nov. 2009, pp. 1-5.
Chen et al., "RESET Current Reduction for Phase Change Memory Based on Standard 0.13-μm CMOS Technology," International Workshop on Automobile, Power and Energy Engineering, Procedia Engineering 16, Aug. 2011, pp. 1-6.

* cited by examiner

*Primary Examiner* — Moazzam Hossain
*Assistant Examiner* — Hajar Kolahdouzan
(74) *Attorney, Agent, or Firm* — Daniel Morris; Otterstedt & Kammer PLLC

(57) ABSTRACT

A phase change memory includes a substrate, a plurality of first phase change elements on the substrate, a plurality of electrodes on the plurality of first phase change elements, and a second phase change element connecting the plurality of electrodes and disposed between the plurality of first phase change elements.

20 Claims, 8 Drawing Sheets

REDUCING CONTACT RESISTANCE OF PHASE CHANGE MEMORY BRIDGE CELL

BACKGROUND

The present disclosure relates generally to a phase change memory (PCM), and more particularly to a phase change memory with reduced contact resistance.

Phase change memory has emerged as a viable option for machine learning. For example, phase change memory can be used to stored weights of a neural network for artificial intelligence (AI) applications. A bridge cell is type of phase change memory including a thin layer of a phase change memory material with two electrodes at the end of the phase change memory.

Typically, in programming a phase change memory operation, electrical pulses are applied through a chalcogenide material to generate local joule heating, where a phase-change material near an electrode contact region can be changed to either crystalline or amorphous state. The phase-change material is typically selected from the group of chalcogenide glasses, such as GeSbTe (germanium-antimony-tellurium or GST).

BRIEF SUMMARY

According to some embodiments of the present invention, a phase change memory includes a substrate; a plurality of first phase change elements on the substrate; a plurality of electrodes on the plurality of first phase change elements; and a second phase change element connecting the plurality of electrodes and disposed between the plurality of first phase change elements.

According to some embodiments, a method of manufacturing a phase change memory includes providing a substrate; depositing a first phase change material on the substrate; depositing an electrode material on the first phase change material; forming a trench by patterning the electrode material and the first phase change material, wherein the trench divides the electrode material into a first electrode and a second electrode; forming a bridge in the trench between the first electrode and the second electrode by depositing a second phase change material, different than the first phase change material; and forming a dielectric encapsulation on the second phase change material in the trench.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:
 a phase change memory bridge cell with reduced parasitic resistance;
 a phase change memory cell having a first element formed of a first phase change memory material (e.g., doped GST or dGST) located between two electrodes for programming and a plurality of second elements formed of a second phase change memory material (e.g., undoped GST), wherein respective ones of the second element direct contact the electrodes;
 undoped GST phase change memory material reducing a contact resistance of a phase change memory and thus improving a dynamic window thereof;
 a phase change memory with a reduce programming current.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Figure 1:
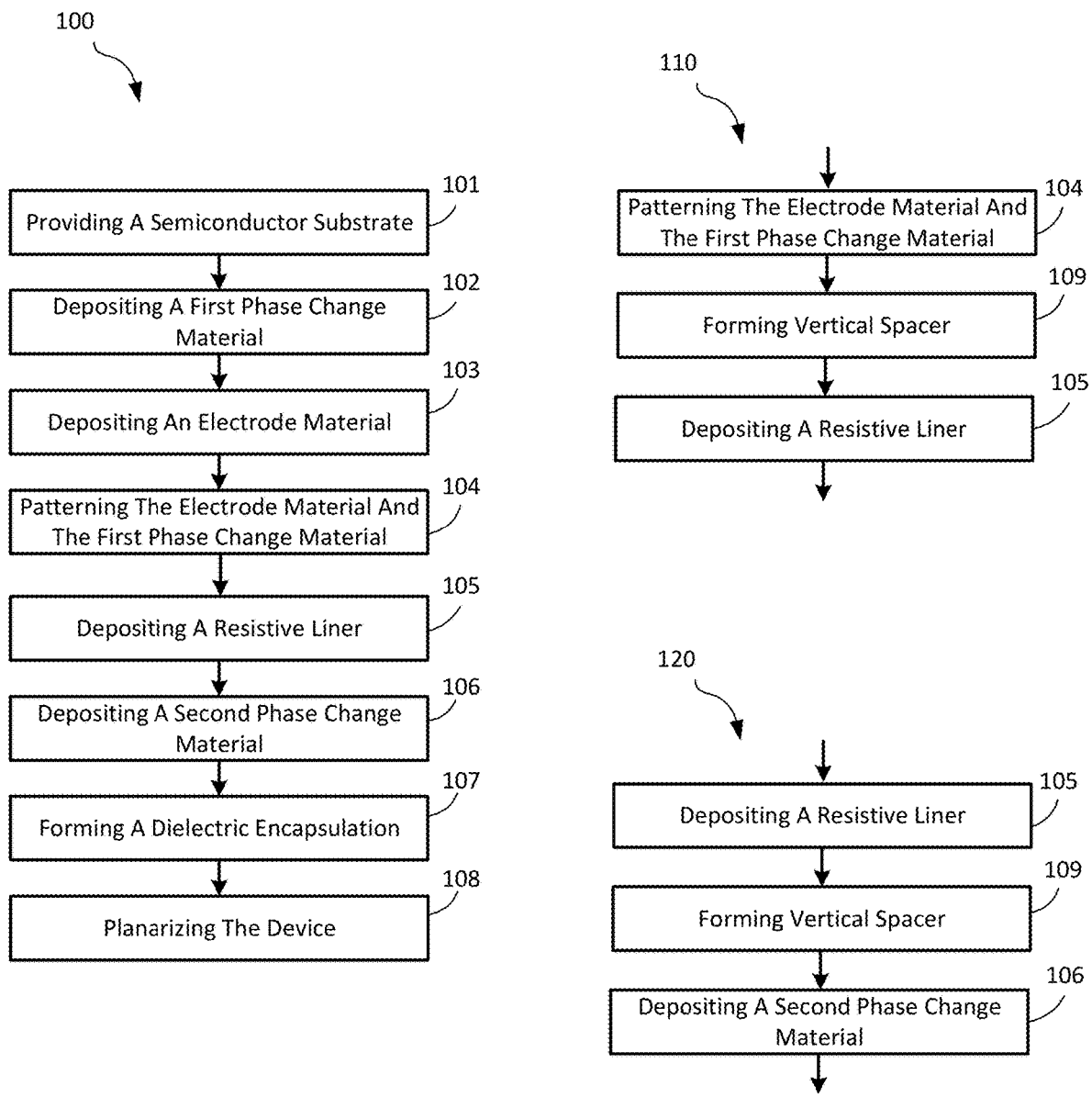
FIG. 1 illustrates methods of forming a phase change memory bridge cell according to one or more embodiments of the present invention.

According to embodiments of the present invention, a phase change memory is configured as a phase change memory bridge cell with reduced parasitic resistance. According to embodiments of the present invention, the phase change memory bridge cell includes a first phase change memory material (e.g., doped GST or dGST) connecting two electrodes and a second phase change memory material (e.g., undoped GST) formed as elements, where each element directly contacts one of the two electrodes. According to some embodiments, the undoped GST reduces a contact resistance of the phase change memory and improves a dynamic window of the phase change memory bridge cell.

According to some aspects, doped GST (e.g., Ge2Sb2Te5) has a lower programming current than undoped GST for phase change memory applications. The contact resistance of doped GST to electrodes is higher than that of undoped GST. Increased contact resistances are associated with increased external resistances, and thus degraded performance of the phase change memory, for example, reducing the ratio between a RESET resistance (the resistance value when the phase change memory is in RESET state) and a SET resistance (the resistance value when the phase change memory is in SET state), which is an undesired side effect for analog computing in artificial intelligence applications.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Referring to FIG. 1, according to some aspects, a method 100 of manufacturing a phase change memory bridge cell includes providing a semiconductor substrate at step 101, depositing a first phase change material (e.g., undoped GST) at step 102, depositing an electrode material (e.g., titanium nitride (TiN)), which has a low contact resistance, on the first phase change material at step 103, patterning the electrode material and the first phase change material at step 104, for example, using a mask, depositing a resistive liner (e.g., tantalum carbide (TaC), TiN (nitrogen rich), tantalum nitride (TaN), etc.) at step 105 that will migrate the resistance drift issue of PCM cell, depositing a second phase change material (e.g., doped GST) to form a bridge between two electrodes at step 106, forming a dielectric encapsulation (e.g., silicon nitride (SiN)) at step 107, and planarizing at step 108.

According to some embodiments, the semiconductor substrate can include other devices such as transistors, isolation structures, contacts, wires, etc.

Figure 2:
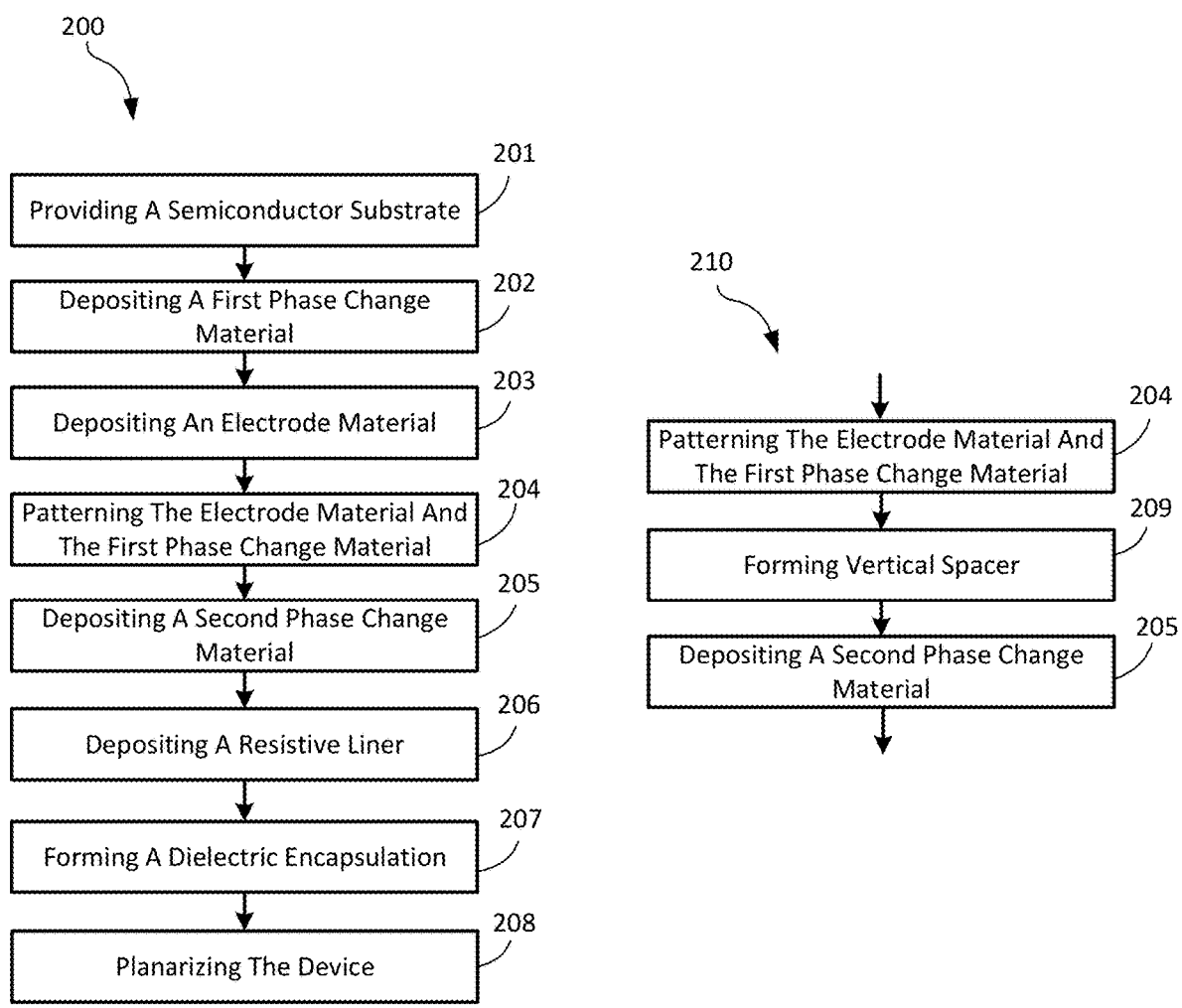
FIG. 2 illustrates methods of forming a phase change memory bridge cell according to one or more embodiments of the present invention.
Figure 8:
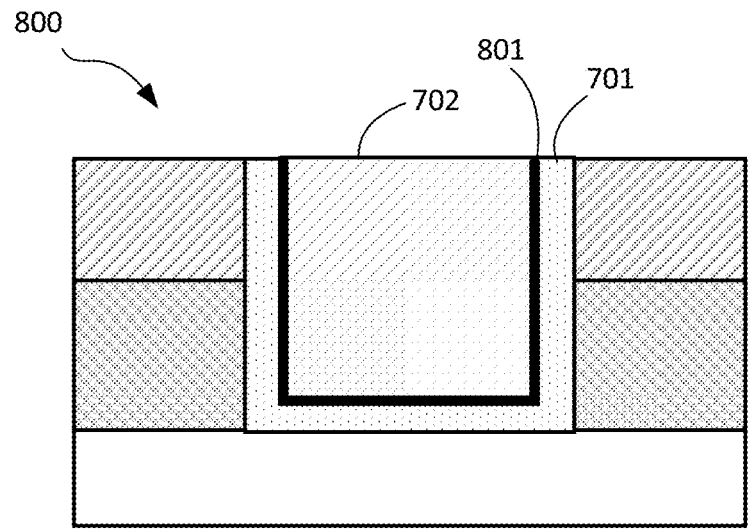
Figure 13:
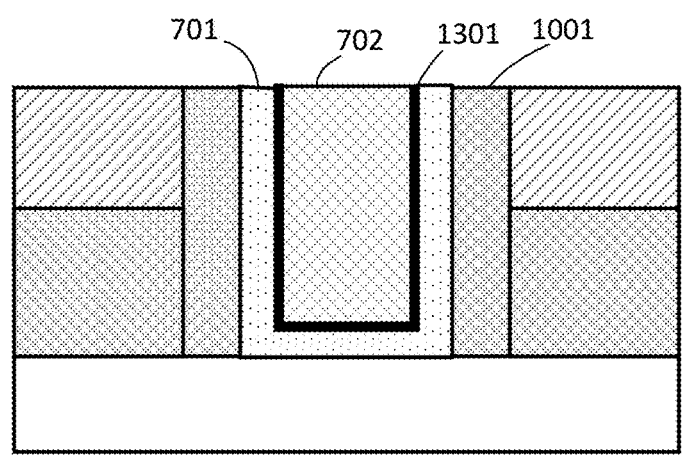
FIG. 13 is a cross-section view of a phase change memory bridge cell according to one or more embodiments of the present invention.

According to at least one embodiment and referring to FIG. 2, a second method 200 of manufacturing a phase change memory bridge cell includes the deposition of the resistive liner at step 206 after the deposition of the second phase change material at step 205 (see also FIG. 8 and FIG. 13). More particularly, the second method 200 can include providing a semiconductor substrate at step 201, depositing the first phase change material at step 202, depositing the electrode material, which has a low contact resistance, on the first phase change material at step 203, patterning the electrode material and the first phase change material at step 204, for example, using a mask, and depositing the second phase change material to form a bridge between two electrodes at step 205. According to some aspects, the second method 200 includes depositing the resistive liner at step 206 after the deposition of the second phase change material at step 205. According to at least one embodiment, a dielectric encapsulation is deposited at step 207, and planarizing at step 208 removes any overburden. According to some aspects, the resistive liner migrates a resistance drift of the phase change memory bridge cell.

Figure 3:
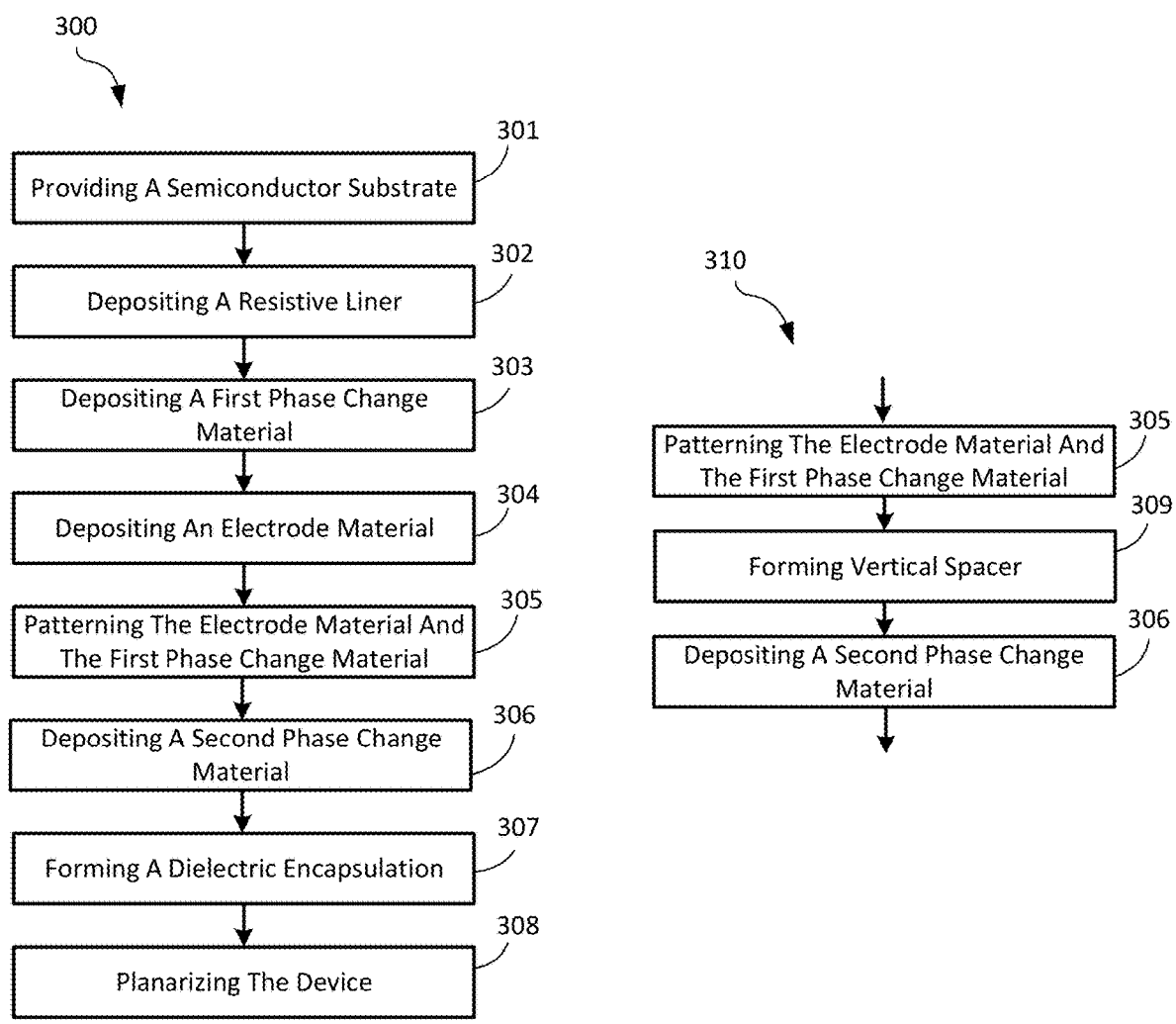
FIG. 3 illustrates methods of forming a phase change memory bridge cell according to one or more embodiments of the present invention.
Figure 9:
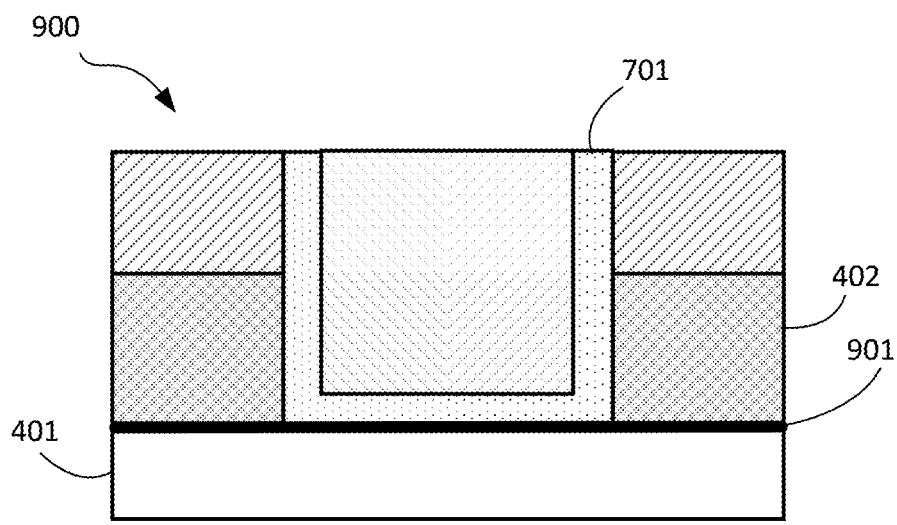
Figure 14:
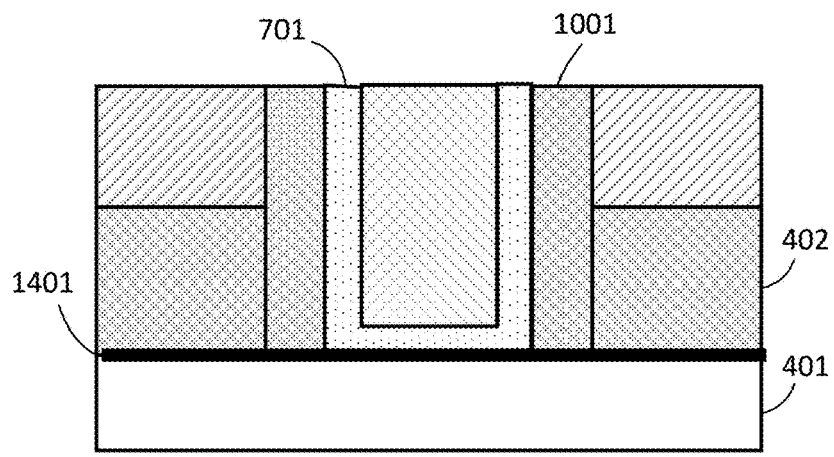
FIG. 14 is a cross-section view of a phase change memory bridge cell according to one or more embodiments of the present invention.

According to some embodiments and referring to FIG. 3, a third method 300 of manufacturing a phase change memory bridge cell includes the deposition of the resistive liner at step 302 before the deposition of the first phase change material at step 303 (see also, FIG. 9 and FIG. 14). More particularly, the third method 300 can include providing the semiconductor substrate at step 301, depositing the resistive liner at step 302 on the semiconductor substrate, depositing the first phase change material at step 303 on the resistive liner, depositing the electrode material, which has a low contact resistance, on the first phase change material at step 304, patterning the electrode material and the first phase change material at step 305, for example, using a lithographic technique, and depositing the second phase change material to form a bridge between two electrodes at step 306. According to some aspects, the third method 300 includes depositing the dielectric encapsulation at step 307, and planarizing the phase change memory bridge cell at step 308 to remove any overburden. According to some aspects, the resistive liner migrates a resistance drift of the phase change memory bridge cell.

Figure 4:
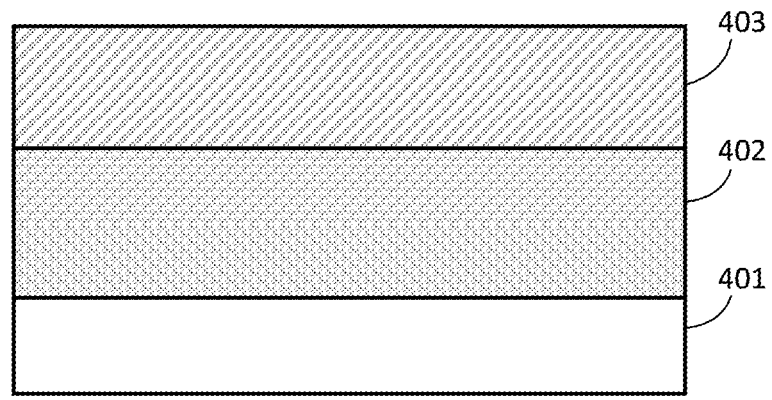
FIGS. 4-9 are cross-section views of a phase change memory bridge cell at different steps in a manufacturing process according to FIG. 1 and one or more embodiments of the present invention.
Figure 5:
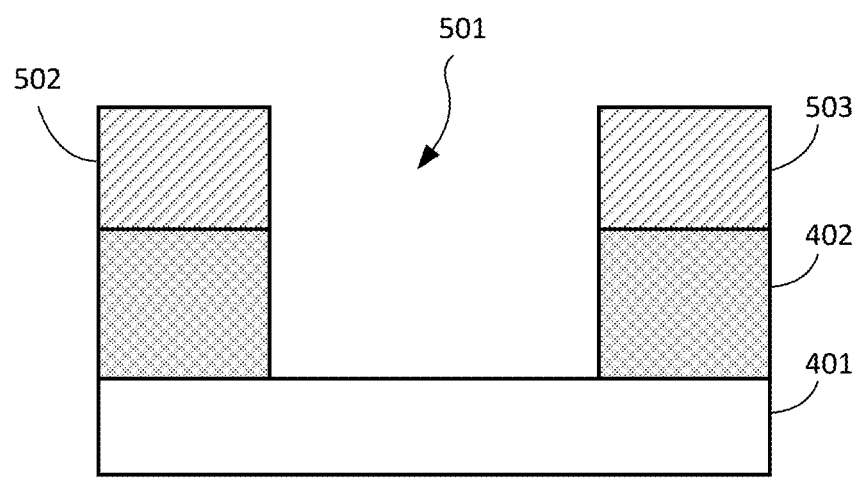
Figure 6:
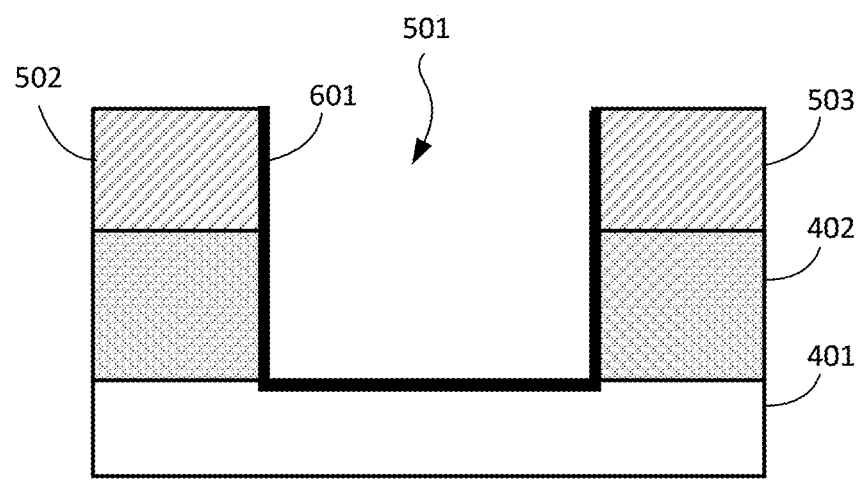
Figure 7:
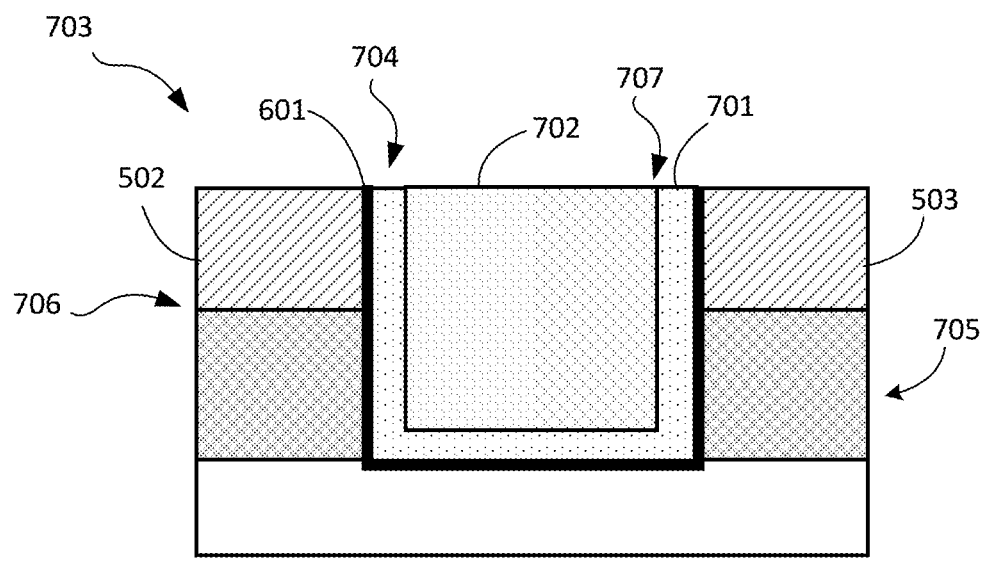

Referring to FIG. 4, according to some aspects, in the method 100 of manufacturing a phase change memory bridge cell 703 (see FIG. 7), a substrate 401 (e.g., a semiconductor substrate) is disposed below a first phase change material 402 (e.g., undoped GST) and an electrode material 403 (e.g., titanium nitride (TiN)), which has a low contact resistance. Referring to FIG. 5, according to some aspects, the electrode material and the first phase change material are patterned, for example, using a mask, forming a first trench 501, and a first electrode 502 and a second electrode 503. Referring to FIG. 6, according to some aspects, a first resistive liner 601 (e.g., tantalum carbide (TaC), TiN (nitrogen rich), tantalum nitride (TaN), etc.) is deposited in the first trench 501. According to some embodiments, the first resistive liner 601 mitigates resistance drift in a phase change memory bridge cell. Referring to FIG. 7, according to some aspects, a second phase change material 701 (e.g., doped GST) is deposited forming a bridge between the first electrode 502 and the second electrode 503, and a dielectric encapsulation 702 (e.g., SiN) is deposited over the second phase change material 701. A planarization removes any overburden of the first resistive liner 601, the second phase change material 701 and the dielectric encapsulation 702 on an upper surface of the phase change memory bridge cell 703.

According to some embodiments, the substrate 401 can include other devices such as transistors, isolation structures, contacts, wires, etc.

According to one or more embodiments, different phase change materials are used in the program region 704 and the contact region 705. For example, dGST can be used in the program region 704 to reduce a reset current (e.g., by about 20 to 80%—non-limiting) and GST can be used in contact region 705 to reduce a contact resistance (e.g., by a factor between about 1.5-20—non-limiting). It should be understood that a reset current is a current needed to program the phase change memory bridge cell, e.g., from a SET state (a relatively low resistance state) to RESET state (a relatively high resistance state). From a material perspective, a reset current is a current needed to melt a portion of a phase change material so that it can be quenched and become amorphous after reset operation.

According to some aspects, the program region 704 refers to the region where phase change memory material undergoes phase change. In the structure shown in FIG. 7, the program region 704 is located in a horizontal portion of the second phase change material 701. According to at least one embodiments, the contact region 705 includes the first electrode 502 and the second electrode 503, the first phase change material 402, and a vertical portion of the program region 704, and more particularly an interface between each of the first electrode 502 and the second electrode 503, and the first phase change material 402, and an interface between the vertical portion of the program region 704 and the first electrode 502, the second electrode 503, and the first phase change material 402 (including the first resistive liner 601).

Interface resistance includes the resistance across first interfaces 706 (i.e., the interfaces between the electrodes and the first phase change material), and the resistance across second interfaces 707 between the first phase change material and the second phase change materials. According to some aspects, the first resistive liner 601 is optional.

According to some embodiments, the first resistive liner 601 mitigates a resistance drift issue of phase change memory. Resistance drift refers to the phenomenon that the resistance of the phase change memory does not stay at a constant value after programming, particularly after a RESET operation after which the phase change material is in amorphous state. Instead, the resistance of the phase change memory changes as a function of time. The resistance of the first resistive liner 601 is substantially greater than the resistance of the phase change memory material in low resistance state (e.g., about ten to forty times higher, or about twenty times higher) and substantially lower than the resistance of the phase change memory material in high resistance state (e.g., about five to fifty times lower, or about ten times lower). From an electrical perspective, the resistance liner is in parallel to the phase change material. The total resistance read by a reading circuit is a combination resistance of both phase change material and the resistance of the resistive liner. When the phase change material in SET state and the resistance drift issue is relatively low, and the resistance liner has a reduced effect. On the other hand, when the phase change material in RESET state (the relatively high resistance state) and the resistance drift is relatively high, the resistive liner can shunt a portion of the read current, diluting the contribution of phase change material to the total resistance and effectively reducing the resistance drift issue.

It should be understood that GST and dGST are example materials, and that other phase change memory materials can be implemented without departing from the scope of the present disclosure. For example, antimony telluride (SbTe) can be used in the contact region 705 in combination with GST in the program region 704 in a case where the electrodes are formed of titanium tungsten (TiW).

According to at least one embodiment and referring to FIG. 8, a second phase change memory bridge cell 800 includes a second resistive liner 801 between the second phase change material 701 and the dielectric encapsulation 702.

According to some embodiments and referring to FIG. 9, a third phase change memory bridge cell 900 includes a third resistive liner 901 on the substrate 401 and below the first phase change material 402 and the second phase change material 701.

Figure 10:
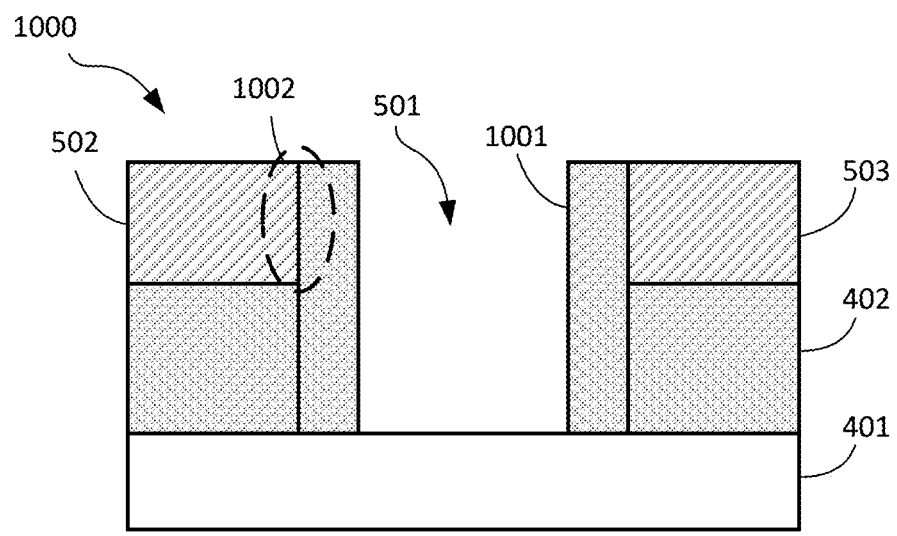
FIGS. 10-11 are cross-section views of a phase change memory bridge cell at different steps in a manufacturing process according to one or more embodiments of the present invention.

According to some embodiments and referring to FIG. 10, a fourth phase change memory bridge cell 1000 includes a third phase change material as a vertical spacer 1001 extending vertically on sidewalls of the first trench 501 (i.e., on exposed sidewalls of the first electrode 502 and the second electrode 503 and the first phase change material 402) to increase a contact area (e.g., in contact area 1002) with the first electrode 502 and the second electrode 503. According to at least one embodiment and referring again to FIG. 1, in a first alternative 110, the vertical spacer 1001 can be formed at step 109, after patterning the electrode material and the first phase change material at step 104 and before the deposition of the resistive liner at step 105. According to some embodiments, the vertical spacer 1001 further reduces the contact resistance by increasing the contact area between the electrodes and the first phase change material (larger contact areas are associated with lower contact resistances). According to some embodiments, the vertical spacer 1001 is formed of a same material as the first phase change material 402 (e.g., GST).

According to some embodiments, the vertical spacer 1001 increases the contact area between the first phase change material 402 and the first electrode 502 and the second electrode 503 and further reduce contact resistance.

Figure 11:
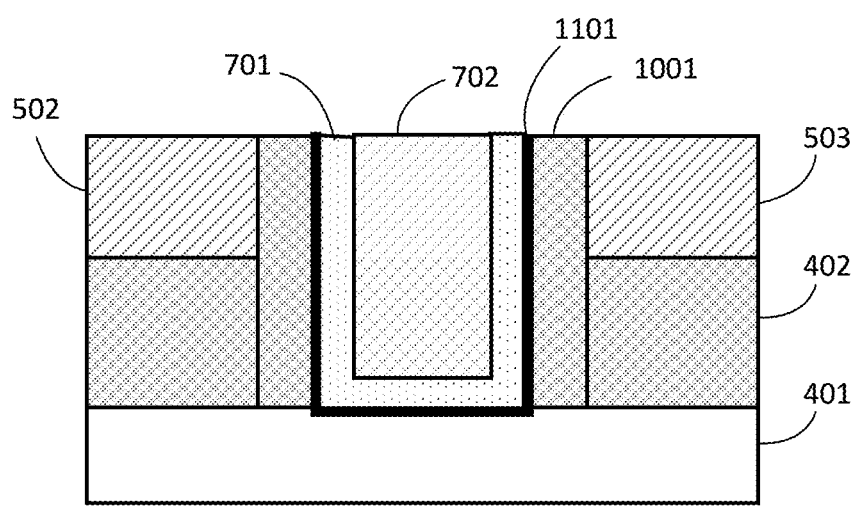

According to some aspects and referring to FIG. 11, a fourth resistive liner 1101 is disposed in the trench on the substrate 401 and sidewalls of the vertical spacer 1001. According to one or more embodiments, the second phase change material 701 and the dielectric encapsulation 702 are formed on the fourth resistive liner 1101.

Figure 12:
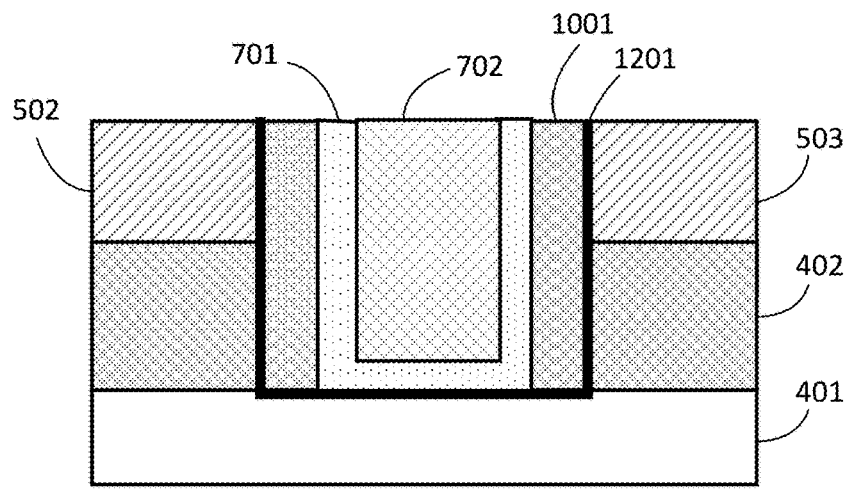
FIG. 12 is a cross-section view of a phase change memory bridge cell according to one or more embodiments of the present invention

According to some aspects and referring to FIG. 12, a fifth resistive liner 1201 is disposed in the trench on the substrate 401 sidewalls of the first phase change material 402 and the first electrode 502 and the second electrode 503. According to some embodiments, the vertical spacer 1001, the second phase change material 701, and the dielectric encapsulation 702 are formed on the fifth resistive liner 1201. According to at least one embodiment and referring again to FIG. 1, in a second alternative 120, the vertical spacer 1001 can be formed at step 109, after the deposition of the resistive liner at step 105 and before the deposition of the second phase change material 701 at step 106.

According to some aspects and referring to FIG. 13, a sixth resistive liner 1301 is disposed between the second phase change material 701 and the dielectric encapsulation 702. According to at least one embodiment and referring again to FIG. 2, in a third alternative 210, the vertical spacer 1001 can be formed at step 209, after patterning the electrode material and the first phase change material at step 204 and before the deposition of the second phase change material 701 at step 205.

According to some aspects and referring to FIG. 14, a seventh resistive liner 1401 is disposed on the substrate 401, below the first phase change material 402 (e.g., GST), the vertical spacer 1001, and the second phase change material 701. According to at least one embodiment and referring again to FIG. 3, in a fourth alternative 310, the vertical spacer 1001 can be formed at step 309, following the patterning of the electrode material and the first phase change material at step 305 and before the deposition of the second phase change material 701 at step 306.

According to some aspects, alternate phase change materials can be used. For example, the a phase change memory bridge cell according to some embodiments can include a phase change material such as germanium-antimony-tellurium (GST), gallium-antimony-tellurium (GaST), silver-iridium-antimony-telluride (AIST) material, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof.

According to example embodiments, the phase change material(s) can be doped (e.g., with one or more of oxygen (O), carbon C, nitrogen (N), silicon (Si), or titanium (Ti)).

According to some embodiments, the first phase change material 402 (e.g., that directly contacting the electrodes) has a lower resistivity than the second phase change material 701 in the program region, for example, about 10 times lower.

According to some aspects, the first electrode 502 and the second electrode 503 can be tungsten (W), aluminum (Al), copper (Cu), cobalt (Co), nickel (Ni), titanium (Ti), ruthenium (Ru), molybdenum (Mo), or any other suitable conductive material. According some example embodiments, a barrier layer (not shown) can be provided between the first phase change material 402 and the electrodes. According to some embodiments, the barrier layer can be titanium nitride (TiN), tantalum nitride (TaN), hafnium nitride (HfN), niobium nitride (NbN), tungsten nitride (WN), tungsten carbon nitride (WCN), or combinations thereof. In various embodiments, the barrier layer can be deposited in the trench(es) by atomic layer deposition (ALD), chemical vapor deposition (CVD), metalorganic chemical vapor deposition (MOCVD), plasma-enhanced chemical vapor deposition (PECVD), or combinations thereof. In various embodiments, the metal fill can be formed by ALD, CVD, PVD, and/or plating, to form the electrical contacts.

According to some aspects, the first resistive liner 601 is comprised of material, including but not limited to, for example, aluminum nitride (AlN), tantalum nitride (TaN), tantalum carbide (TaC), titanium nitride (TiN), titanium carbide (TiC), boron nitride (BN), aluminum oxide (AlO), TaN, tungsten nitride (WN), cobalt tungsten (CoW), nickel tungsten (NiW), or yttrium oxide (YO).

Recapitulation:

According to embodiments of the present invention, a phase change memory includes a substrate (401); a plurality of first phase change elements (first phase change material 402) on the substrate; a plurality of electrodes (first electrode 502 and second electrode 503) on the plurality of first phase change elements; and a second phase change element (second phase change material 701) connecting the plurality of electrodes and disposed between the plurality of first phase change elements.

According to some embodiments, a method of manufacturing a phase change memory includes providing a substrate (step 101); depositing a first phase change material on the substrate (step 102); depositing an electrode material on the first phase change material (step 103); forming a trench by patterning the electrode material and the first phase change material (step 104), wherein the trench divides the electrode material into a first electrode and a second electrode; forming a bridge in the trench between the first electrode and the second electrode by depositing a second phase change material (step 106), different than the first phase change material; and forming a dielectric encapsulation (step 107) on the second phase change material in the trench.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory comprising:
   a substrate;
   a plurality of first phase change elements on the substrate;
   a plurality of electrodes on the plurality of first phase change elements; and
   a second phase change element connecting the plurality of electrodes and disposed between the plurality of first phase change elements, wherein:
      the plurality of first phase change elements on the substrate and the plurality of electrodes on the plurality of the first phase change elements form a first trench;
      the second phase change element is a layer disposed on sidewalls of the first trench; and
      the second phase change element forms a second trench.

2. The phase change memory of claim 1, wherein the second phase change element has a first contact resistance with the plurality of electrodes and the plurality of first phase change elements have a second contact resistance with the plurality of electrodes, wherein the first contact resistance is less than the second contact resistance.

3. The phase change memory of claim 1, wherein the plurality of first phase change elements are an undoped germanium-antimony-tellurium material and the second phase change element is a doped germanium-antimony-tellurium material.

4. The phase change memory of claim 1, wherein the plurality of electrodes are titanium nitride electrodes.

5. The phase change memory of claim 1, further comprising a first resistive liner between the second phase change element and the plurality of electrodes, the plurality of first phase change elements, and the substrate.

6. The phase change memory of claim 5, wherein the first resistive liner is one of a tantalum carbide material, a titanium nitride material, and a tantalum nitride material.

7. The phase change memory of claim 1, wherein the second phase change element is a bridge between the plurality of electrodes.

8. The phase change memory of claim 1, further comprising a dielectric encapsulation on the second phase change element, wherein the dielectric encapsulation fills the second trench formed by the second phase change element.

9. The phase change memory of claim 8, further comprising a second resistive liner between the second phase change element and the dielectric encapsulation.

10. The phase change memory of claim 1, further comprising a third resistive liner between the second phase change element and the substrate and between the plurality of first phase change elements and the substrate.

11. The phase change memory of claim 1, wherein the phase change memory further comprising a vertical spacer on sidewalls of the first trench.

12. The phase change memory of claim 11, further comprising a fourth resistive liner on the substrate and between the vertical spacer and the second phase change element.

13. The phase change memory of claim 11, further comprising a fifth resistive liner on the substrate and between on the sidewalls of the first trench and the vertical spacer.

14. The phase change memory of claim 11, wherein the second phase change element is a layer disposed on sidewalls of the first trench, the phase change memory further comprising:
   a dielectric encapsulation in the second trench formed by the second phase change element; and
   a sixth resistive liner between the second phase change element and the dielectric encapsulation.

15. The phase change memory of claim 11, further comprising a seventh resistive liner on the substrate below the plurality of first phase change elements, the vertical spacer, and the second phase change element.

16. A method of manufacturing a phase change memory comprising:
   providing a substrate;
   depositing a first phase change material on the substrate;
   depositing an electrode material on the first phase change material;
   forming a first trench by patterning the electrode material and the first phase change material, wherein the first trench divides the electrode material into a first electrode and a second electrode;
   forming a bridge in the first trench between the first electrode and the second electrode by depositing a second phase change material, different than the first phase change material, wherein the second phase change material is a layer disposed on sidewalls of the first trench and the second phase change material forms a second trench; and
   forming a dielectric encapsulation on the second phase change material, wherein the dielectric encapsulation fills the second trench.

17. The method of manufacturing a phase change memory of claim 16, further comprising planarizing the second phase change material and the dielectric encapsulation.

18. The method of manufacturing a phase change memory of claim 16, further comprising forming a resistive liner, wherein the resistive liner is formed in the first trench under the second phase change material, between the second phase change material and the dielectric encapsulation, or directly on the substrate under the first phase change material and the second phase change material.

19. The method of manufacturing a phase change memory of claim 16, further comprising forming a vertical spacer in the first trench before depositing a second phase change material.

20. A phase change memory comprising:
   a substrate;
   a plurality of first phase change elements on the substrate;
   a plurality of electrodes on the plurality of first phase change elements; and a second phase change element connecting the plurality of electrodes and disposed between the plurality of first phase change elements;

wherein the plurality of first phase change elements on the substrate and the plurality of electrodes on the plurality of first phase change elements form a first trench, and the second phase change element is a layer disposed on sidewalls of the first trench, and a dielectric encapsulation fills a second trench formed by the second phase change element.

* * * * *